United States Patent
Nam et al.

(10) Patent No.: US 7,884,667 B2
(45) Date of Patent: Feb. 8, 2011

(54) PULSE AREA MODULATION AND HIGH-EFFICIENCY LINEAR POWER AMPLIFIER SYSTEM USING THE SAME

(75) Inventors: Sang-Wook Nam, Seoul (KR); Young-Sang Jeon, Daejeon (KR)

(73) Assignee: Seoul National University Industry Foundation, Seoul (KR)

( * ) Notice: Subject to any disclaimer, the term of this patent is extended or adjusted under 35 U.S.C. 154(b) by 225 days.

(21) Appl. No.: 12/226,207

(22) PCT Filed: Jan. 19, 2007

(86) PCT No.: PCT/KR2007/000309
§ 371 (c)(1),
(2), (4) Date: Oct. 10, 2008

(87) PCT Pub. No.: WO2007/117074
PCT Pub. Date: Oct. 18, 2007

(65) Prior Publication Data
US 2009/0273396 A1    Nov. 5, 2009

(30) Foreign Application Priority Data
Apr. 11, 2006 (KR) .................... 10-2006-0032578

(51) Int. Cl.
H03F 3/38 (2006.01)
(52) U.S. Cl. .................. 330/10; 330/124 R; 330/295
(58) Field of Classification Search .............. 330/10, 330/124 R, 295
See application file for complete search history.

(56) References Cited

U.S. PATENT DOCUMENTS

| 4,714,884 | A  | * | 12/1987 | Glover .................. 324/309 |
| 6,724,249 | B1 |   | 4/2004  | Nilsson |
| 6,759,899 | B2 | * | 7/2004  | Lennartson et al. ......... 330/10 |
| 6,771,121 | B2 |   | 8/2004  | Nilsson et al. |
| 7,321,262 | B2 | * | 1/2008  | Nielsen et al. ............. 330/10 |
| 7,518,442 | B1 | * | 4/2009  | Dijkstra et al. ............. 330/10 |

FOREIGN PATENT DOCUMENTS

KR    10-2005-61013    6/2005

OTHER PUBLICATIONS

Hirachi, et al. "A Novel Control Strategey on Single-Phase PWM Current Source Inverter Incorporating Pulse Area Modulation" Power Conversion Conference, Nagaoka, Japan Aug. 6, 1997, ISBN 0-7803-3823-5, vol. 1 pp. 289-294.

* cited by examiner

*Primary Examiner*—Patricia Nguyen
(74) *Attorney, Agent, or Firm*—Husch Blackwell LLP

(57) ABSTRACT

A linear power amplifier system using pulse area modulation includes: an envelop/phase decomposer for decomposing an input signal into an envelop signal and a phase signal; a pulse area modulator for modulating the envelop signal such that an area of the modulated envelop signal is proportional to an amplitude of the envelop signal; a control signal generator for converting the modulated envelop signal into a control signal; an automatic gain adjuster for equalizing pulse height of the modulated envelop signal; a mixer for mixing the phase signal with the output of the automatic gain adjustor to produce a RF pulse train; a power amplifier for amplifying the RF pulse train, to generate an amplified RF pulse train; and a band pass filter for restoring the original input signal from the amplified RF pulse train. The output level of the power amplifier is controlled by the control signal.

18 Claims, 7 Drawing Sheets

FIG. 2

| AMPLITUDE OF BASEBAND SIGNAL | PULSE WIDTH | INBAND COMPONENT | HARMONIC COMPONENTS |
|---|---|---|---|
| 0 | 0 | 0 | 0 |
| 0.1 | 0.1 | 0.01 | 0.09 |
| 0.2 | 0.2 | 0.04 | 0.16 |
| 0.3 | 0.3 | 0.09 | 0.21 |
| 0.4 | 0.4 | 0.16 | 0.24 |
| 0.5 | 0.5 | 0.25 | 0.25 |
| 0.6 | 0.6 | 0.36 | 0.24 |
| 0.7 | 0.7 | 0.49 | 0.21 |
| 0.8 | 0.8 | 0.64 | 0.16 |
| 0.9 | 0.9 | 0.81 | 0.09 |
| 1.0 | 1.0 | 1.00 | 0 |

PULSE AREA MODULATION AND HIGH-EFFICIENCY LINEAR POWER AMPLIFIER SYSTEM USING THE SAME

FIELD OF THE INVENTION

The present invention relates to pulse area modulation (PAM) and a high-efficiency linear power amplifier system using the same; and, more particularly, to the linear power-amplifier system adopting the PAM capable of reducing harmonic components without having to use a high-Q band pass filter.

BACKGROUND OF THE INVENTION

As various mobile communication systems are developed, an efficiency of mobile terminals becomes a very important factor. Specifically, low-power circuits for the mobile terminals are required because the capacities and the sizes of battery cells have a limitation. Among components of the mobile terminals, power amplifiers are dominant power-consumers, so that the efficiency of the mobile terminals adopting, e.g., a CDMA or an OFDM, is at most 20%. The reason why the efficiency of the mobile terminals adopting the CDMA or the OFDM is low is that the envelopes of signals vary. For the purpose of amplifying the signals whose envelopes vary in the time domain, linear amplifiers of, e.g., class A or class AB are required. However, the class A or the class AB amplifier has poor efficiency in that they have great power losses.

Various techniques have been proposed for amplifying a signal linearly with much better efficiency. Among the techniques is Pulse Width Modulation (i.e., PWM) capable of amplifying a signal whose envelope varies in the time domain. A high-efficiency linear power amplifier system adopting the PWM was suggested by Yuanxun Wang (see "An Improved Kahn Transmitter Architecture Based on Delta-Sigma Modulation", 2003 IEEE MTT-S Int. Microwave Symp. Dig., pp. 1327-1330). Specifically, a radio frequency (RF) signal fed into the high-efficiency linear power amplifier system is modulated by using the PWM; the pulse-width modulated signal is amplified by applying it to a switching amplifier such as class D, E or F power amplifier; and the amplified signal, i.e., the output of the switching amplifier, passes through a band pass filter (i.e., BPF), thereby restoring the waveform of the original RF signal. Herein, the linear power amplifier system has high efficiency in that the switching amplifier is operated only under two modes, i.e., ON and OFF, and has good linearity in that the amplitude of the output thereof is proportional to only the pulse width of the signal modulated by the PWM.

FIG. 1 shows a block diagram of a conventional high-efficiency linear power amplifier system using the pulse width modulation (PWM). The conventional high-efficiency linear power amplifier system includes an envelope/phase decomposer 102, a pulse width modulator 103, a mixer 104, a high-efficiency power amplifier 105 and a band pass filter (BPF) 106. Specifically, an RF input signal 101 is decomposed into an envelope signal 108 and an RF phase signal 109 by the envelope/phase decomposer 102, wherein the RF phase signal 109, whose amplitude does not vary in the time domain, includes only phase information of the RF input signal 101. Then, the pulse width modulator 103 modulates the decomposed envelope signal 108 to thereby produce a pulse-width modulated signal whose pulse width is proportional to the amplitude of the envelope signal 108. On the other hand, the decomposed phase signal 109 is mixed with the pulse-width modulated signal at the mixer 104 to thereby generate an RF pulse train 110, which is fed into the high-efficiency power amplifier 105, e.g., a switching power amplifier such as class D, E or F power amplifier. Subsequently, the high-efficiency power amplifier 105 amplifies the RF pulse train 110 to thereby create an amplified RF pulse train, which is applied to the BPF 106. Finally, after filtering harmonic components of the amplified RF pulse train at the BPF 106, an amplified input signal 107 whose waveform is identical to the original RF input signal 101 except the size thereof may be restored.

Although the high-efficiency linear power amplifier system has ideally 100% efficiency, the BPF 106 may not eliminate the harmonic components perfectly because the harmonic components are generated adjacent to an inband signal in the frequency domain, resulting in degradation of the linearity, i.e., the efficiency of the linear power amplifier.

FIG. 2 is a table showing the variance of amounts of both the inband component and the harmonic components as a function of a pulse width, which is proportional to an amplitude of a baseband signal, wherein the baseband signal is modulated by the PWM. Referring to FIG. 2, as the amplitude of the baseband signal decreases, i.e., as the pulse width decreases, the amount of the harmonic components becomes relatively larger than that of the inband component.

SUMMARY OF THE INVENTION

It is, therefore, an object of the present invention to provide a pulse area modulation method and a high-efficiency linear power amplifier system using the same, capable of effectively reducing the harmonic components without having to use a high-Q band pass filter in the linear power amplifier system.

It is another object of the present invention to provide the pulse area modulation method and the high-efficiency linear power amplifier system using the same, capable of enhancing the efficiency of the linear power amplifier system by reducing the harmonic components in the linear power amplifier system.

In accordance with one aspect of the present invention, there is provided a pulse area modulation method for amplifying an input signal, whose values are $f(t_1), f(t_2), \ldots f(t_n)$ at times $t_1, t_2, \ldots t_n$, respectively, at which the input signal is sampled for a pulse modulation, the values of the input signal having a characteristic that if the input signal were modulated by the pulse width modulation (PWM), the pulse width modulated signal would have a waveform with a height of 1 and with widths of $x_1, x_2, \ldots x_n$, wherein $x_k$ is proportional to $f(t_k)$ ($1<=k<=n$), wherein in case the values of the input signal having a minimum value of m and a maximum value of M are partitioned by threshold values $Th_1, Th_2, \ldots Th_{n-1}$, while an inequality: $m<Th_1<Th_2<\ldots<Th_{n-1}<M$ is satisfied, if the value of the input signal at $t_k$ satisfies an inequality: $f(t_k)<=Th_1$, the modulated input signal by the pulse area modulation method has a waveform with a height of $H_1$ and with a width of $x_1*H_1$, if the value of the input signal at $t_k$ satisfies an inequality: $Th_{q-1}<f(t_k)<=Th_q$, the modulated input signal by the pulse area modulation method has a waveform with a height of $1/H_q$ and with a width of $x_q*H_q$, and if the value of the input signal at $t_k$ satisfies an inequality: $f(t_k)>Th_{n-1}$, the modulated input signal by the pulse area modulation method has a waveform with a height of $1/H_n$ and with a width of $x_n*H_n$, wherein $1<=H_n<H_{n-1}<\ldots<H_1$ and $2<=q<=n-1$.

In accordance with another aspect of the present invention, there is provided a pulse area modulation method for amplifying an input signal i(t) which is fed to a power amplifier system, comprising the steps of: modulating the input signal i(t) such that an area of a modulated signal $i_M(t)$ is proportional to an amplitude of the input signal i(t); and amplifying the modulated signal $i_M(t)$, wherein the area of the modulated signal $i_M(t)$ is determined by an area between a t-axis (a time axis) and the waveform of the modulated signal $i_M(t)$.

In accordance with still another aspect of the present invention, there is provided a high-efficiency linear power amplifier system using the pulse area modulation including an envelop/phase decomposer for decomposing an input signal into an envelop signal and a phase signal; a pulse area modulator for modulating the decomposed envelop signal such that an area (multiplication of a pulse height and a pulse width) of the modulated envelop signal is proportional to an amplitude of the envelop signal; a control signal generator for converting the modulated envelop signal into a control signal; an automatic gain adjuster for equalizing the pulse height of the modulated envelop signal while maintaining the pulse width to be equal that of the modulated envelop signal; a mixer for mixing the decomposed phase signal with the output of the automatic gain adjustor to produce a RF pulse train having a pulse width which is identical to that of the modulated envelop signal; a power amplifier for amplifying the RF pulse train, while an output level thereof is controlled by the control signal, to generate an amplified RF pulse train; and a band pass filter for restoring the original input signal from the amplified RF pulse train.

BRIEF DESCRIPTION OF THE DRAWINGS

FIG. 2 is a table showing the variance of amounts of both the inband component and the harmonic components as a function of a pulse width, which is proportional to an amplitude of a baseband signal, wherein the baseband signal is modulated by the PWM;

DETAILED DESCRIPTION OF THE PREFERRED EMBODIMENTS

To fulfill the above-described objects, the present invention proposes a pulse area modulation (PAM) technique. The efficiency of a power amplifier can be enhanced by using the PAM by reducing harmonic components. Herein, the term "PAM" (pulse area modulation), which is newly proposed in the specification of the present invention, should be distinguished from the well-known term "PAM" (pulse amplitude modulation).

The PAM is a technique of modulating an input signal such that a modulated pulse has an area, which is proportional to the amplitude of the input signal. Unlike the well-known PWM, whose pulse has a fixed height, the PAM has at least two different pulse heights, which are determined by considering the amplitude of the input signal. Thus, both the width and the height of the modulated pulse vary in the PAM technique as the amplitude of the input signal varies in the time domain, while only pulse width varies in the PWM technique. Though both waveforms have same pulse areas, the PAM waveform has fewer harmonic components than that of the PWM.

Figure 1:
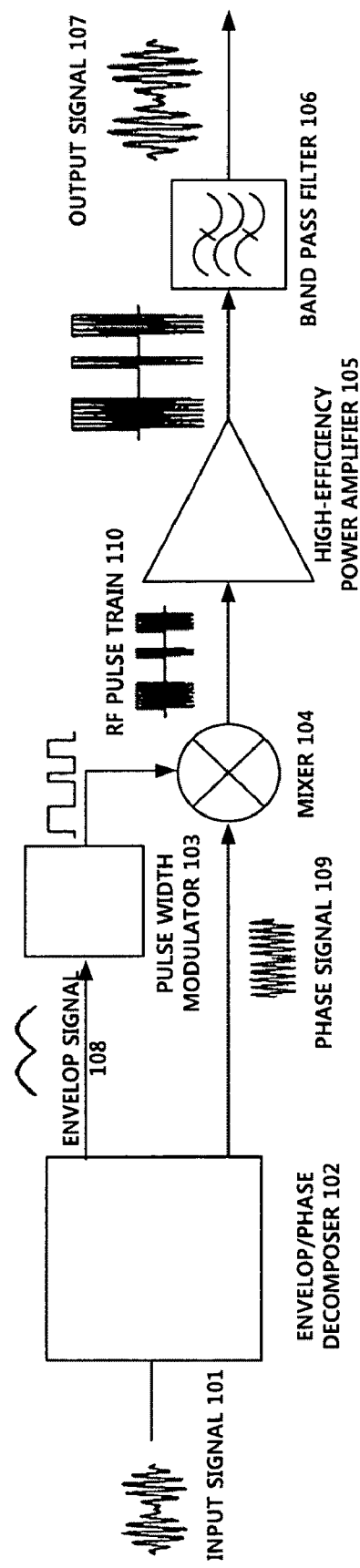
FIG. 1 is a block diagram showing a conventional high-efficiency linear power amplifier system using pulse width modulation (PWM)
Figure 3:
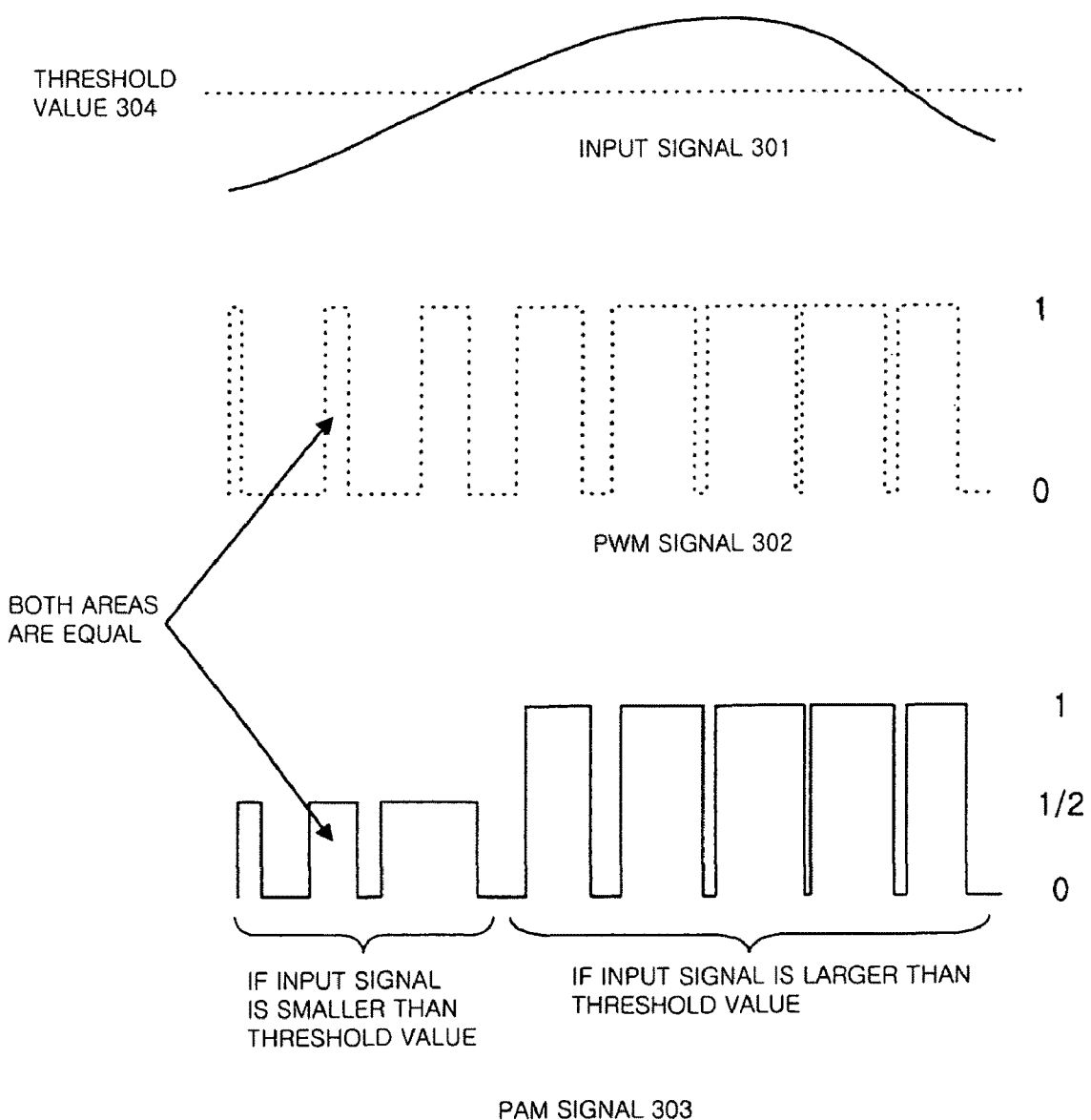
FIG. 3 presents a diagram for comparing a waveform of a signal modulated by the PWM with that modulated by PAM, i.e., pulse area modulation.

FIG. 3 is a diagram for comparing a waveform of a PWM signal 302 with that of a PAM signal 303 according to an input signal 301. Assuming that the PAM signal 303 has two pulse amplitude levels, e.g., 1 and ½ by determining a number of a threshold value to be 1, as shown in FIG. 3, when the input signal 301 is sampled for a pulse modulation at times $t_1$, $t_2, \ldots t_n$, respectively (a switching period for the sampling may or may not vary), if the input signal 301 is greater than the threshold value 304, the pulse amplitude level, i.e., the pulse height becomes 1; otherwise, it becomes ½. In case the input signal 301 is less than the threshold value 304, i.e., the pulse amplitude level is ½, the pulse width of the PAM signal 303 should be two times wider than that of the PWM signal 302 because the pulse area of the PAM signal 303 represents the amplitude of the input signal 301. Therefore, the pulse width of the PAM signal 303 is required to be wider than that of the PWM signal 302 for the same input signal 301. Herein, although the pulse width of the PAM signal 303 at $t_k$ (1<=k<=n-1) becomes wider than that of the PWM signal 302, the pulse width of the PAM signal 303 cannot be wider than $t_{k+1}-t_k$. The PAM signal 303 has two amplitude levels in FIG. 3, but it may have generally N (N is a natural number greater than 1) pulse amplitude levels if the number of the threshold value 304 is N-1. Moreover, each of the pulse amplitude levels of the PAM signal 303 may be arbitrarily determined according to communication schemes. Furthermore, the intervals between adjacent threshold values may or may not vary.

Comparing the PAM signal 303 with the PWM signal 302, since the pulse heights of the PAM signal 303 are always less than or equal to those of the PWM signal 302 for the same input signal 301 at an arbitrary time, the pulse widths of the PAM signal 303 should be greater than or equal to those of the PWM signal 302 in order to maintain the pulse area of the PAM signal 303 to be identical to that of the PWM signal 302. Referring to FIG. 2, as the pulse widths become wider in pulse modulation techniques, the ratio of harmonic components to inband signal component becomes lower. Therefore, the PAM signal 303 generally has less harmonic components than the PWM signal 302.

Figure 4:
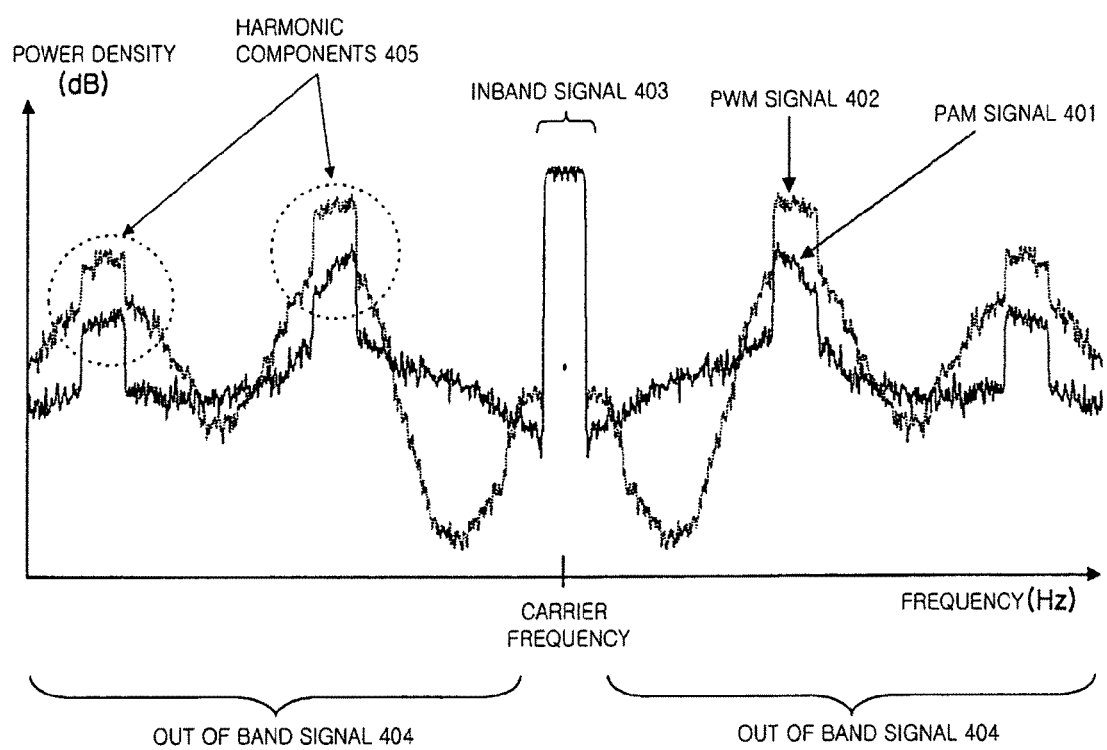
FIG. 4 represents simulation results comparing amplitudes of harmonic components when a satellite DMB signal is modulated by using the PWM with those of harmonic components when modulated by the PAM in the frequency domain.

FIG. 4 shows simulation results comparing the amplitude of the harmonic components in the frequency domain in case a satellite DMB signal is converted into the PAM signal with that in case the satellite DMB signal is converted into the PWM signal. In the simulation, an S-band, which corresponds to a frequency band of the real satellite DMB signal, is used as a carrier frequency.

A PAM signal 401 and a PWM signal 402 have the identical amplitude in an inband frequency domain 403, but the harmonic components of the PAM signal 401 are considerably decreased in an out-of-band frequency domain 404. The harmonic components of the PAM signal 401 become decreased as a number N of the pulse amplitude levels for realizing the PAM is increased. For example, in case the number N is 2, e.g., the pulse amplitude levels of ½ and 1, the harmonic components of the PAM signal 401 are less than those of the PWM signal 402 by 5 dB, while in case the number N is 4, e.g., the pulse amplitude levels of ¼, 2/4, ¾ and 1, the harmonic components of the PAM signal 401 are less than those of the PWM signal 402 by 10 dB. Furthermore, the efficiency of a power amplifier using the PAM becomes increased as the number N of the pulse amplitude levels increases. For example, in case the number N is 2, e.g., the pulse amplitude levels of ½ and 1, the efficiency of the power amplifier using the PAM is higher than that using the PWM by 30%, while in case the number N is 4, e.g., the pulse amplitude levels of ¼, 2/4, ¾ and 1, the efficiency of the power amplifier using the PAM is higher than that using PWM by 50%.

In short, the high-efficiency linear power amplifier system adopting the PAM, capable of reducing the harmonic components in comparison with the PWM, is provided in accordance with the present invention. Since the harmonic components are tremendously reduced by applying the PAM, the filter's burden for filtering off the harmonic components in the high-efficiency linear power amplifier system may be also reduced. Moreover, the efficiency of the power amplifier system may be enhanced since the reduced harmonic components imply that the energy loss due to the harmonic components is decreased.

The following detailed description of the present invention illustrates preferred embodiments of the high-efficiency linear power amplifier system using the pulse area modulation (PAM) with reference to the attached drawings.

Figure 5:
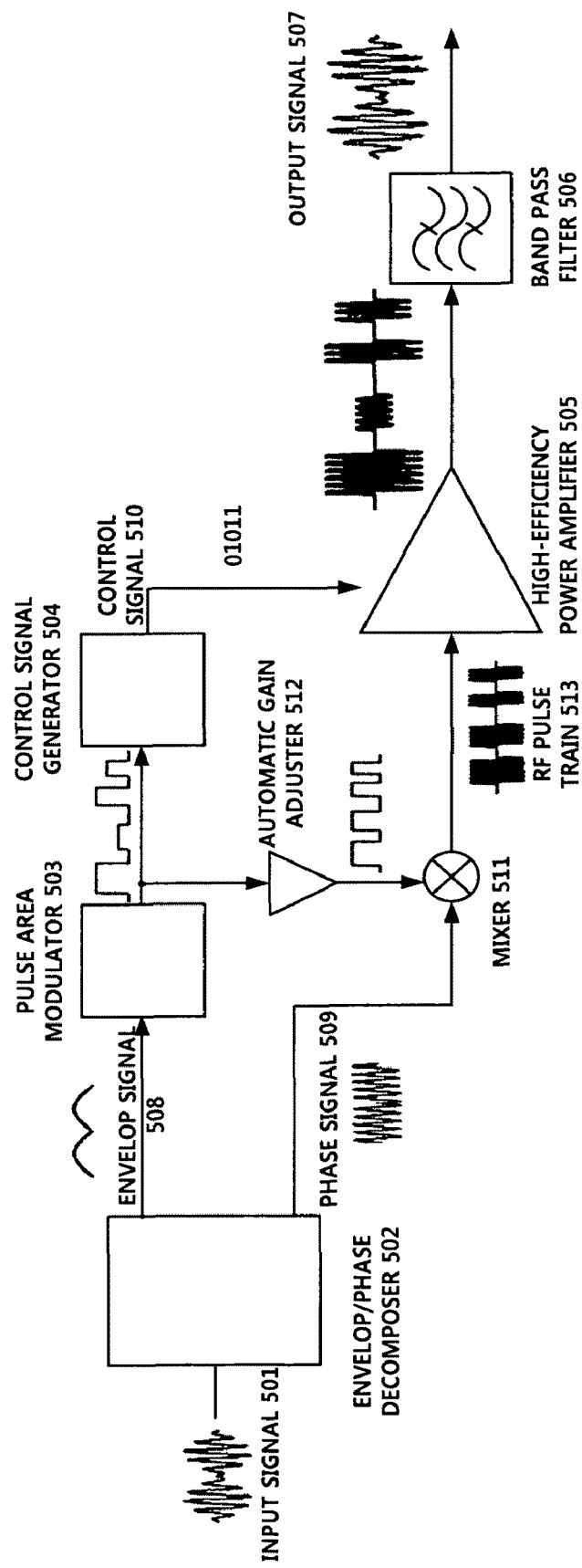
FIG. 5 represents a high-efficiency linear power amplifier system using the PAM in accordance with a preferred embodiment of the present invention.

FIG. 5 depicts a high-efficiency linear power amplifier system using the PAM in accordance with a preferred embodiment of the present invention. The high-efficiency linear power amplifier system is composed of: an envelop/phase decomposer 502 for decomposing an input signal 501 into an envelop signal 508 and a phase signal 509; a pulse area modulator 503 for modulating the envelop signal 508 by the PAM technique; a control signal generator 504 for converting the modulated envelop signal into a control signal 510; an automatic gain adjuster 512 for equalizing a pulse height of the modulated envelop signal while maintaining a pulse width to be equal to that of the modulated envelop signal, to thereby provide an adjusted modulated envelop signal; a mixer 511 for producing a RF pulse train 513 by mixing the phase signal 509 and the adjusted modulated envelop signal, i.e., the output of the automatic gain adjuster 512; a high-efficiency power amplifier 505, which is controlled by the control signal 510, for amplifying the RF pulse train 513 efficiently, to thereby provide an amplified RF pulse train; and a band pass filter 506 for generating an output signal 507 whose waveform is identical to that of the input signal 501 except size thereof.

The high-efficiency linear power amplifier system using the PAM may be operated as follows: If the input signal 501 is fed to the envelop/phase decomposer 502, the input signal 501 is decomposed into the envelope signal 508 and the RF phase signal 509 by the envelop/phase decomposer 502. The concept of the envelop/phase decomposer 502 is similar to that of a polar modulator which is used in a GSM terminal. The phase signal 509, which is a RF signal containing phase information of the input signal 501, has a constant envelop which is invariable in the time domain. The decomposed envelop signal 508 is modulated by the pulse area modulator 503 such that a pulse area is proportional to the amplitude of the envelop signal 508 in order to enhance the efficiency. The pulse area modulated envelop signal is applied to the control signal generator 504 for converting the pulse area modulated envelop signal into a control signal 510. The control signal 510 determines the pulse amplitude levels of an output of the high-efficiency power amplifier 505. Since the control signal 510 varies at a low speed in comparison with the input signal 501, the power amplifier 505 may be designed without losing its efficiency.

On the other hand, the decomposed RF phase signal 509 is mixed with the output of the automatic gain adjuster 512, to thereby produce the RF pulse train 513, which is amplified by the high-efficiency power amplifier 505, wherein the high-efficiency power amplifier 505 need not to be a linear amplifier, but it is preferably a switch mode power amplifier such as class E, D or F amplifiers. Even though the high-efficiency power amplifier 505 is not a linear amplifier, the input signal 501 is restored accurately by using the band pass filter 506. In order to restore the input signal 501 accurately while maintaining the linearity, an on-time duration of the RF phase signal 509, which is applied to the high-efficiency power amplifier 505 via the mixer 511, is required to be controlled. The on-time duration of the RF phase signal 509 is conventionally defined as a duty ratio of the RF pulse train 513. The duty ratio of the RF pulse train 513, which is applied to the high-efficiency power amplifier 505, is adjusted to be equal to the pulse width of the output of the pulse area modulator 503, while the amplitude of the RF pulse train 513 is constant regardless of the waveform of the input signal 501. For the purpose of generating the RF pulse train 513 satisfying the above-described conditions, the pulse area modulated signal is applied to the automatic gain adjuster 512, capable of equalizing the pulse height of the pulse area modulated signal while maintaining the pulse width to be equal to that of the modulated envelop signal, and then the output of the automatic gain adjuster 512 is mixed with the RF phase signal 509 at the mixer 511.

The high-efficiency power amplifier system using the PAM satisfies its linearity by simultaneously controlling the height and the duty ratio of the RF pulse train 513. That is, even if the input signal 501 is small, the high-efficiency power amplifier system using the PAM may satisfy its linearity by increasing the duty ratio of the RF pulse train 513 and reducing the pulse height of the output of the high-efficiency power amplifier 505 by the control signal 510. In case of a conventional power amplifier system using the PWM, if the pulse width corresponding to the amplitude of the input signal is 0.2, the duty ratio of the RF pulse train should be 0.2. However, the high-efficiency power amplifier system using the PAM can satisfy its linearity by reducing the pulse height of the high-efficiency power amplifier 505 to ¼ of that of the conventional power amplifier using the PWM by the control signal 510 while increasing the duty ratio of the RF pulse train 513 up to 0.8.

To control the pulse height of the output of the power amplifier 505 without decreasing its efficiency, a plurality of small-sized power amplifiers are connected in parallel while each of the small-sized power amplifiers is switched on or off by applying the control signal 510 including a plurality of control signals for controlling the respective small-sized power amplifiers thereto.

Figure 6:
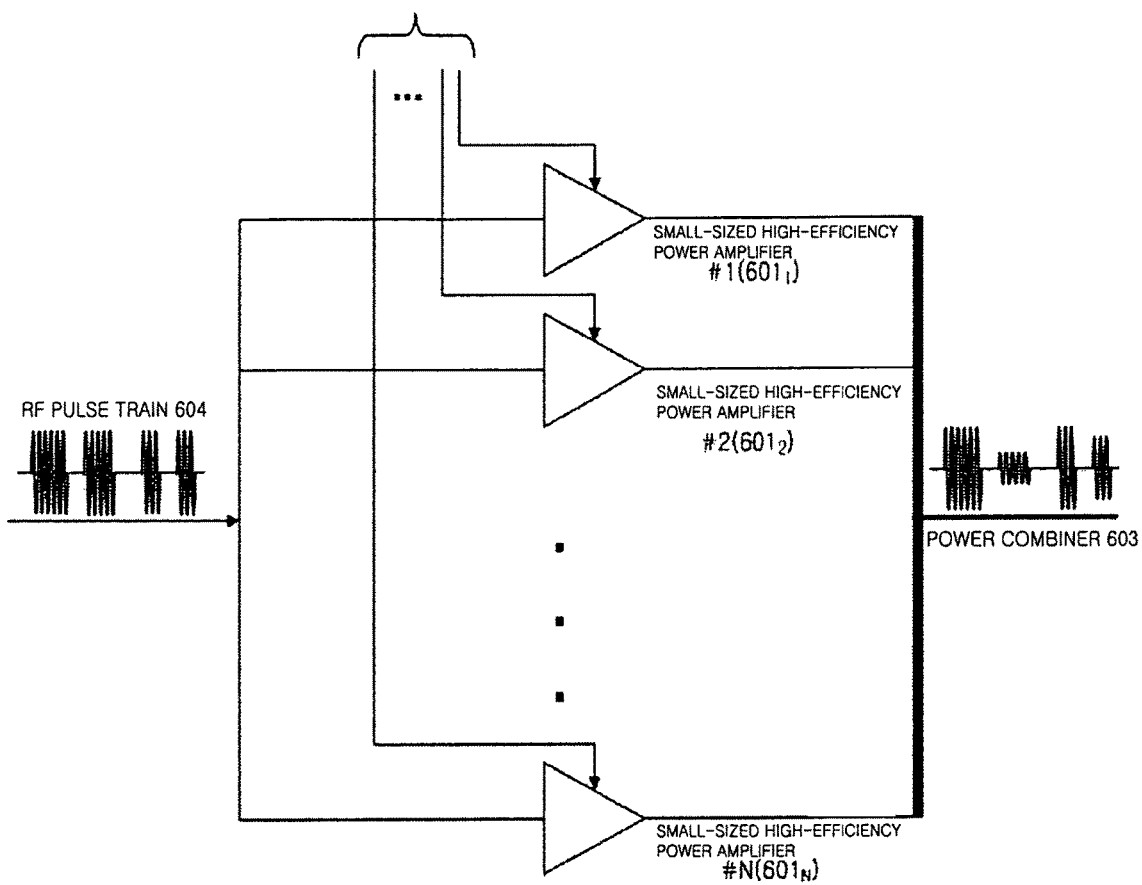
FIG. 6 represents the first preferred embodiment of a high-efficiency power amplifier, capable of controlling its output level, i.e., a pulse height, in accordance with the present invention.

FIG. 6 presents the first embodiment 600 of the high-efficiency power amplifier 505 of FIG. 5, capable of controlling its output, i.e., a pulse height, in accordance with the present invention. The high-efficiency power amplifier 600 is composed of a plurality of the small-sized high-efficiency power amplifiers $601_1$~$601_N$ which are connected in parallel. Moreover, the pulse height of the output of the high-efficiency power amplifier 600 may be controlled by switching on or switching off each of the small-sized high-efficiency power amplifiers $601_1$~$601_N$ respectively by applying the control signal 602. The control signal 602 in FIG. 6 is identical to the control signal 510 in FIG. 5; and the RF pulse train 604 in FIG. 6 is identical to the RF pulse train 513 in FIG. 5. Each of the small-sized high-efficiency power amplifiers is independently switched on or switched off by applying the control signal 602 thereto and the outputs of the small-sized high-efficiency power amplifiers are integrated by using a power combiner. If there are 4 small-sized high-efficiency power amplifiers and the respective outputs of the small-sized high-efficiency power amplifiers are 1 W, the control signal 602 should be composed of 4-bit, thereby determining the output levels of the high-efficiency power amplifier 600 to be 1 W, 2 W, 3 W, 4 W. If N small-sized high-efficiency power amplifiers $601_1$~$601_N$ have different output capacities, the high-efficiency power amplifier 600 can have $2^N$ output levels theoretically by N-bit control signal.

Figure 7:
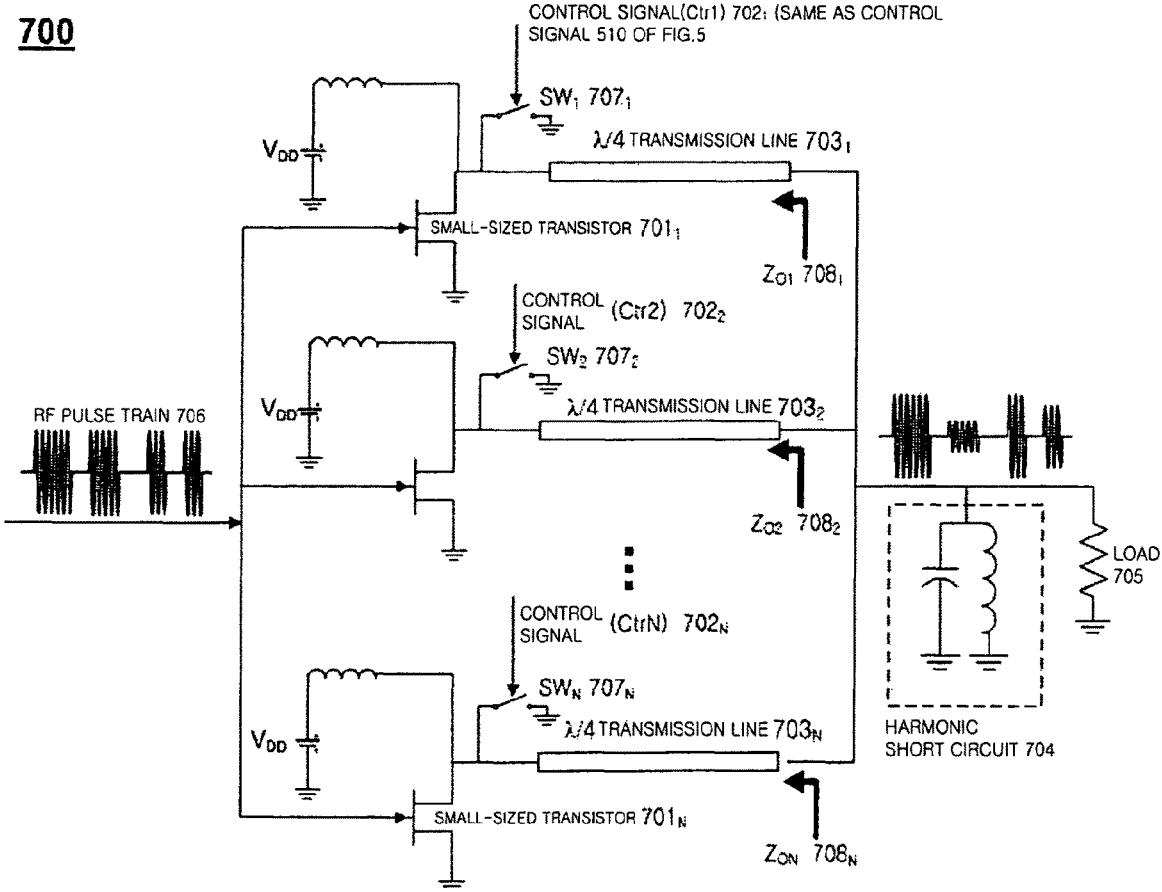
FIG. 7 represents the second preferred embodiment of a high-efficiency power amplifier, capable of controlling its output level in accordance with the present invention.

FIG. 7 shows the second preferred embodiment 700 of the high-efficiency power amplifier 505 of FIG. 5, capable of controlling its output, i.e., a pulse height, in accordance with the present invention. As shown in FIG. 6, in case the high-efficiency power amplifier 600 includes two or more small-sized high-efficiency power amplifiers $601_1$~$601_N$ connected in parallel, each of the small-sized high-efficiency power amplifiers might be affected by the rest of the small-sized high-efficiency power amplifiers. Therefore, each of the small-sized high-efficiency power amplifiers is preferably required to be operated independently in order to guarantee the stable operation of the power amplifier even when faults occur at any one of the small-sized high-efficiency power amplifiers. In order that each of the small-sized high-efficiency power amplifiers connected in parallel is operated independently, the output of the small-sized high-efficiency power amplifiers are delayed by using λ/4 (λ: carrier wavelength) transmission lines, respectively, and then the delayed outputs are integrated.

Specifically, as shown in FIG. 7, N small-sized transistors $701_1$~$701_N$ are connected in parallel and RF switches $707_1$~$707_N$, which are controlled by control signals $702_1$~$702_N$ respectively, are connected between the output ports of the small-sized transistors and the GND (ground) respectively, wherein a bundle of the control signals $702_1$~$702_N$, capable of controlling the output level, i.e., the pulse height, of the high-efficiency power amplifier 700, are identical to the control signal 510 of FIG. 5.

Moreover, the transistors may be switched on or switched off by applying a RF pulse train 706 thereto. The RF pulse train 706, which is an input signal of the transistors in FIG. 7, is identical to the RF pulse train 513 in FIG. 5. Each of the small-sized transistors $701_1$~$701_N$ in FIG. 7 functions as a switch-mode power amplifier. Furthermore, one ends, i.e., the input ports, of the λ/4 transmission lines $703_1$~$703_N$ are connected to the output ports of the small-sized transistors respectively; and a harmonic short circuit 704 and a load 705 are connected in parallel between the other ends, i.e., the output ports, of the λ/4 transmission lines $703_1$~$703_N$ and the GND.

By delaying the outputs of the transistors by using the λ/4 transmission lines, output impedances (i.e., $Zo_1$~$Zo_N$) $708_1$~$708_N$ of the λ/4 transmission lines become infinity. Since the output impedances $708_1$~$708_N$ are infinity, an electric current flows only toward the load 705 (never flows toward the λ/4 transmission lines having infinite output impedances). Thus, N transistors $701_1$~$701_N$ connected in parallel may be operated independently. For example, whether a first transistor $701_1$ is switched on or off by a control signal $702_1$, it does not affect the outputs of the other transistors $701_2$~$701_N$ at all.

Meanwhile, in the circuit of FIG. 7, the reason why the output impedances $708_1$~$708_N$ viewed from the output port of the λ/4 transmission lines are determined to be infinity is that original output impedances, viewed from the input port of the λ/4 transmission lines, are transformed into infinity by impedance transformation principle. Since the outputs of the transistors are delayed by λ/4 transmission lines, and the harmonic short circuit 704 functions as a short circuit for the harmonic components, the impedance transformation principle may be applied as described above. The harmonic short circuit 704 is preferably composed of a parallel LC resonance circuit, which is connected between the output port of the λ/4 transmission lines and the GND. The parallel LC resonance circuit may be implemented by using either lumped elements or distributed elements.

While the invention has been shown and described with respect to the preferred embodiments, it will be understood by those skilled in the art that various changes and modification may be made without departing from the spirit and scope of the invention as defined in the following claims.

EFFECT OF THE INVENTION

In accordance with the present invention, the harmonic components may be considerably reduced by modulating the input signal by using the PAM, compared to the PWM, so that the high-Q band pass filter may not be required in the high-efficiency linear power amplifier system. Moreover, the efficiency of the high-efficiency linear power amplifier system can be considerably enhanced by reducing the harmonic components.

What is claimed is:

1. A pulse area modulation method for amplifying an input signal, whose values are $f(t1)$, $f(t_2)$, ... $f(t_2)$ at times $t_1$, $t_2$, ... $t_n$, respectively, at which the input signal is sampled for a pulse modulation, the values of the input signal having a characteristic that if the input signal were modulated by the pulse width modulation (PWM), the pulse width modulated signal would have a waveform with a height of 1 and with widths of $x_1$, $x_2$, ... $x_n$, wherein $x_k$ is proportional to $f(t_k)$ (1<=k<=n), wherein in case the values of the input signal having a minimum value of m and a maximum value of M are partitioned by threshold values $Th_1$, $Th_2$, ... $Th_{n-1}$, while an inequality: $m<Th_1<Th_2<...<Th_{n\_}<M$ is satisfied, if the value of the input signal at tk satisfies an inequality: $f(t_k)<=Th_1$, the modulated input signal by the pulse area modulation method has a waveform with a height of $H_1$ and with a width of $x_1 *H_1$, if the value of the input signal at tk satisfies an inequality: $Th_{q-1}<f(t_k)<=Th_q$, the modulated input signal by the pulse area modulation method has a waveform with a height of $1/H_q$ and with a width of $x_q*H_q$, and if the value of the input signal at $t_k$ satisfies an inequality: $f(t_k)>Th_{n-1}$, the modulated input signal by the pulse area modulation method has a waveform with a height of $1/H_n$ and with a width of $x_n*H_n$, wherein $1<=H_n<H_{n-1}<...<H_1$ and $2<=q<=n-1$.

2. The pulse area modulation method of claim 1, wherein a switching period $t_a-t_{a-1}$ (2<=a <=n) are not constant.

3. The pulse area modulation method of claim 1, wherein the width of the modulated pulse (the modulated input signal) satisfies an inequality: $x_{a-1}*H_{a-1}<=t_a-t_{a-1}$ (2<=a <=n).

4. The pulse area modulation method of claim 1, wherein the $H_n$ is 1.

5. The pulse area modulation method of claim 1, wherein intervals between adjacent threshold values ($Th_b - Th_{b-1}$ for $2 <= b <= n-1$) are constant.

6. The pulse area modulation method of claim 1, wherein intervals between adjacent heights ($1/H_a - 1/H_{a-1}$ for $2 <= a <= n$) are constant.

7. The pulse area modulation method of claim 1, wherein the modulated input signal by the pulse area modulation method has a height of 0 except sections where the heights and the widths thereof are $1/H_k$, $x_k * H_k$ respectively.

8. A pulse area modulation method for amplifying an input signal i(t) which is fed to a power amplifier system, comprising the steps of:
   modulating the input signal i(t) such that an area of a modulated signal $i_M(t)$ is proportional to an amplitude of the input signal i(t);
   amplifying the modulated signal $i_M(t)$, wherein the area of the modulated signal $i_M(t)$ is determined by an area between a t-axis (a time axis) and the waveform of the modulated signal $i_m(t)$; and
   wherein an amplitude of the modulated signal $i_M(t)$ is determined as one of N predetermined amplitude levels by comparing the amplitude of the input signal i(t) with N−1 threshold values.

9. The pulse area modulation method of claim 8, wherein the input signal i(t) is an envelop signal.

10. A high-efficiency linear power amplifier system using the pulse area modulation comprising:
    an envelop/phase decomposer 502 for decomposing an input signal 501 into an envelop signal 508 and a phase signal 509;
    a pulse area modulator 503 for modulating the decomposed envelop signal 508 such that an area (multiplication of a pulse height and a pulse width) of the modulated envelop signal is proportional to an amplitude of the envelop signal 508;
    a control signal generator 504 for converting the modulated envelop signal into a control signal 510;
    an automatic gain adjuster 512 for equalizing the pulse height of the modulated envelop signal while maintaining the pulse width to be equal that of the modulated envelop signal;
    a mixer 511 for mixing the decomposed phase signal 509 with the output of the automatic gain adjustor 512 to produce a RF pulse train 513 having a pulse width which is identical to that of the modulated envelop signal;
    a power amplifier 505 for amplifying the RF pulse train 513, while an output level thereof is controlled by the control signal 510, to generate an amplified RF pulse train; and
    a band pass filter 506 for restoring the original input signal 501 from the amplified RF pulse train.

11. The high-efficiency linear power amplifier system of claim 10, wherein a pulse width of the RF pulse train 513 is equal to that of the modulated envelop signal and a height of the RF pulse train 513 is constant regardless of the input signal 501.

12. The high-efficiency linear power amplifier system of claim 10, wherein the output of the power amplifier 505 is discretely controlled according to the control signal 510.

13. The high-efficiency linear power amplifier system of claim 10, wherein the power amplifier 505 includes a plurality of small-sized power amplifiers $601_1 \sim 601_N$ which are connected in parallel, and
    wherein the output level of the power amplifier 505 is controlled by switching on or switching off the respective small-sized power amplifiers $601_1 \sim 601_N$ by the control signal 510.

14. The high-efficiency linear power amplifier system of claim 10, wherein the power amplifier 505 is a switch mode power amplifier.

15. The high-efficiency linear power amplifier system of claim 13, wherein output capacities of the small-sized power amplifiers $601_1 \sim 601_N$ are different.

16. The high-efficiency linear power amplifier system of claim 10, wherein the power amplifier 505 includes a plurality of small-sized transistors $701_1 \sim 701_N$ which are connected in parallel,
    wherein respective $\lambda/4$ ($\lambda$ is a wavelength of a carrier frequency) transmission lines $703_1 \sim 703_N$ are connected to each output port of the small-sized transistors,
    wherein a harmonic short circuit 704 and a load 705 are connected in parallel between the output ports of the $\lambda/4$ transmission lines and a ground(GND), and
    wherein the output level of the power amplifier 505 is controlled by switching on or off the small-sized transistors $701_1 \sim 701_N$ respectively by the control signal 510.

17. The high-efficiency linear power amplifier system of claim 16, wherein the harmonic short circuit 704 is a parallel LC resonance circuit.

18. The high-efficiency linear power amplifier system of claim 16, wherein RF switches $707_1 \sim 707_N$ are connected between the output ports of the small-sized transistors and the GND, and
    wherein the small-sized transistors are switched on or off by applying the control signal 510 thereto.

* * * * *